United States Patent
Huang et al.

(10) Patent No.: US 6,191,000 B1
(45) Date of Patent: Feb. 20, 2001

(54) SHALLOW TRENCH ISOLATION METHOD USED IN A SEMICONDUCTOR WAFER

(75) Inventors: Chin-Yi Huang, Hsin-Chu Hsien; Chin-Jen Huang, Hsin-Chu; Chen-Chin Liu, Yun-Lin Hsien; Yun Chang, Hsin-Chu, all of (TW)

(73) Assignee: Macronix International Co., Ltd., Hsin-Chu (TW)

( * ) Notice: Under 35 U.S.C. 154(b), the term of this patent shall be extended for 0 days.

(21) Appl. No.: 09/378,700

(22) Filed: Aug. 23, 1999

(51) Int. Cl.$^7$ ................................................. H01L 21/76
(52) U.S. Cl. ........................... 438/424; 438/401; 438/427
(58) Field of Search ..................................... 438/424, 427, 438/428, 426, 433, 435, 437, 404, 405, 401, FOR 227; 148/DIG. 102

(56) References Cited

U.S. PATENT DOCUMENTS

| | | | |
|---|---|---|---|
| 5,721,172 | * | 2/1998 | Jang et al. ............................ 438/424 |
| 5,880,007 | * | 3/1999 | Varian et al. ........................ 438/427 |
| 5,889,335 | * | 3/1999 | Kuroi et al. ......................... 438/401 |
| 5,998,279 | * | 12/1999 | Liaw ..................................... 438/424 |
| 6,043,133 | * | 3/2000 | Jang et al. ............................ 438/424 |
| 6,057,210 | * | 5/2000 | Yang et al. ........................... 438/427 |
| 6,060,370 | * | 5/2000 | Hsia et al. ............................ 438/424 |

* cited by examiner

Primary Examiner—Michael Trinh
(74) Attorney, Agent, or Firm—Winston Hsu

(57) ABSTRACT

The invention relates to a shallow trench isolation method used in a semiconductor wafer that comprises a plurality of predetermined active regions, a plurality of shallow trenches used for electrically isolating the plurality of active regions, and a wafer alignment region wherein at least one recess having a predetermined pattern is formed on the surface of the wafer. In the method of the present invention, an insulation layer is first formed on the surface of the semiconductor wafer to fill the recesses in the wafer alignment region and the plurality of shallow trenches. An etching process is then implemented to reduce the thickness of the insulation layer on the surface of the working region, the working region having a relatively high density of active regions. Also, the insulation layer is completely removed from the recesses within the wafer alignment region. Finally, a chemical mechanical process (CMP) is performed on the surface of the semiconductor wafer to remove the insulation layer and to keep the surface of the insulation layer in the shallow trenches even with the semiconductor wafer.

7 Claims, 4 Drawing Sheets

SHALLOW TRENCH ISOLATION METHOD USED IN A SEMICONDUCTOR WAFER

BACKGROUND OF THE INVENTION

1. Field of the invention

The present invention relates to a shallow trench isolation method used in a semiconductor wafer.

2. Description of the Prior Art

Either a localized oxidation isolation (LOCOS) method or a shallow trench isolation method is typically used in semiconductor manufacturing to isolate electronic components from each other so as to prevent short-circuiting. Since the field oxide and bird's beak generated by the LOCOS process occupies a very large area on the semiconductor wafer, the shallow trench isolation method is used for most advanced semiconductor manufacturing processing. In the shallow trench isolation method, isolation of components is achieved by carving shallow trenches in between elements on the surface of wafer then filling the trenches with isolation material. This results in electrical isolation of the components. The regions between adjacent trenches are called active regions.

FIG. 1 and FIG. 2 are schematic diagrams of cross-sectional views of the semiconductor wafer used to perform the manufacturing process of the shallow trench isolation of the prior art. In the fabrication of the wafer 10, a wafer alignment region 16 is first defined on the silicon substrate 20 of the wafer 10 prior to performing shallow trench isolation. This is labeled as region A in FIG. 1. A plurality of recesses 18 having a predetermined pattern is formed in the wafer alignment region 16 to be used as standard reference points for the stepper. This ensures precision in the transfer of the mask pattern onto the surface of the wafer 10 during the photolithography process. Afterwards, a silicon oxide layer 22 and a silicon nitride layer 24 are formed in sequence on the silicon substrate 20. This is then followed by the formation of a plurality of active regions 14 and their isolating shallow trenches 12 by removing a predetermined region of the silicon nitride layer 24 and silicon oxide layer 22 as well as a predetermined depth of the silicon substrate 20 on the wafer 10. Region B in FIG. 2 is the working region 28 and has a relatively high density of active regions 14.

FIGS. 3 through 6 are schematic diagrams of the shallow trench isolation method in a semiconductor manufacturing process of the prior art. The manufacturing process of the shallow trench isolation proceeds following the completion of the fabrication of the wafer 10 and its shallow trenches 12. As shown in FIG. 3, in the prior art method of shallow trench isolation, an insulation layer 26 is first formed on the surface of the wafer 10 that fills the shallow trenches 12 and the recesses 18. Then, as shown in FIG. 4, an etching process is implemented to remove a predetermined thickness of the insulation layer 26 from the surface of the active regions 14 and the wafer alignment region 16. As shown in FIG. 5, a chemical mechanical polishing (CMP) process is then performed to remove the insulation layer 26 from the surface of the wafer 10 such that the surface of the insulation layer 26 in each shallow trench 12 is flush with the surface of the silicon nitride layer 24. Finally, as shown in FIG. 6, a photolithographic process and a wet etching process are applied to the wafer alignment region 16 to completely remove the insulation layer 26 from the recesses 18 to complete the shallow trench isolation process.

As shown in FIG. 4, since the density of active regions 14 in the working region 28 is relatively high, the average thickness of the insulation layer 26 is higher in the working region 28 than outside of the working region following removal of the insulation layer 26 to a predetermined thickness through etching of the wafer 10. As shown in FIG. 5, this makes it difficult for the surface of the insulation layer 26 in the shallow trenches 12 of the working region 28 to be level with the surface of the silicon nitride layer 24 after subsequent CMP processing. However, excessive polishing in order to keep the surface of the insulation layer 26 in the shallow trenches 12 at the same level as the surface of the silicon nitride layer 22 will result in the insulation layer 26 being excessively low in the shallow trenches 12 outside the working region 28. This will consequently affect the electrical isolation effect.

SUMMARY OF THE INVENTION

Therefore, the primary objective of the present invention is to provide a shallow trench isolation method such that the thickness of the insulation layer in each shallow trench will not be affected by different densities of the active regions, and the method of the present invention can completely remove the insulation layer from the recesses of the wafer alignment region.

The shallow trench isolation (STI) method used in a semiconductor wafer wherein the surface of the semiconductor wafer comprising a plurality of active regions, a plurality of shallow trenches for electrically isolating the active regions and an alignment region having at least a recess of predetermined pattern therein comprises the following steps:

1. Forming an insulation layer on the surface of the semiconductor wafer that completely fills the trenches and the recess in the alignment region.
2. Etching the insulation layer on the active regions and alignment region to a predetermined thickness.
3. Defining at least one working area on the surface of the semiconductor wafer over which the density of the active regions in the working area is higher than that of the active regions outside the working area, and etching the insulation layer on the working area and the alignment region to reduce the thickness of the insulation layer on the working area and to completely remove the insulation layer on the alignment region.
4. Performing a chemical mechanical polishing process to horizontally remove the insulation layer on the surfaces of the active regions and to approximately level the surfaces of the insulation layer in the trenches with the surfaces of the active regions.

It is an advantage of the present invention that the thickness of the insulation layer does not vary with shallow trench density in the working region and the insulation layer within the shallow trenches are therefore flush with the wafer surface without excessive polishing. This leads to better electrical isolation.

These and other objects and the advantages of the present invention will no doubt become obvious to those of ordinary skill in the art after having read the following detailed description of the preferred embodiment that is illustrated in the various figures and drawings.

DETAILED DESCRIPTION OF THE PREFERRED EMBODIMENT

Figure 7:
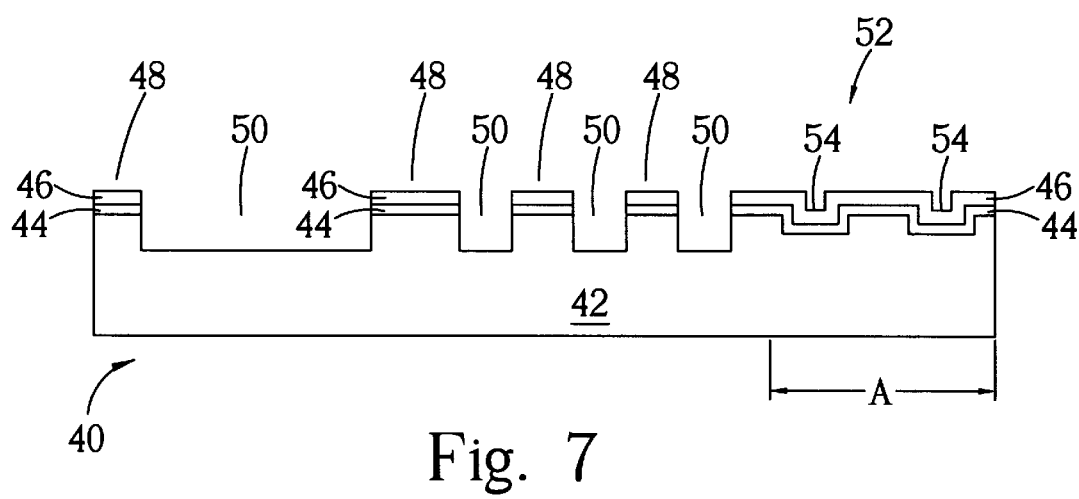
FIG. 7 through FIG. 11 are schematic diagrams of the shallow trench isolation method in a semiconductor manufacturing process of the present invention.

FIG. 7 through FIG. 11 are schematic diagrams of the shallow trench isolation method in a semiconductor manufacturing process of the present invention. As shown in FIG. 7, the previously described method is used to form a shallow trench 50 on a semiconductor wafer 40. The surface of the semiconductor wafer comprises a plurality of predetermined active regions 48, a plurality of shallow trenches 50 for electrically isolating the active regions 48, and a wafer alignment region 52. Predetermined regions are present beside the active regions 48. Each shallow trench 50 is formed by removing a predetermined depth of the surface of the semiconductor wafer from these predetermined regions. As shown in FIG. 7, the wafer alignment region 52 labeled as region A comprises at least one predetermined recess 54 pattern on the surface of the wafer 40. The wafer 40 comprises a silicon substrate 42, a silicon nitride layer 46 positioned on the wafer alignment region 52 and the active regions 48 on the surface of the silicon substrate 42, and a silicon oxide layer 44 between the silicon nitride layer 46 and the silicon substrate 42 to prevent stress-induced damage to the silicon substrate 42 from the silicon nitride layer 46.

Figure 8:
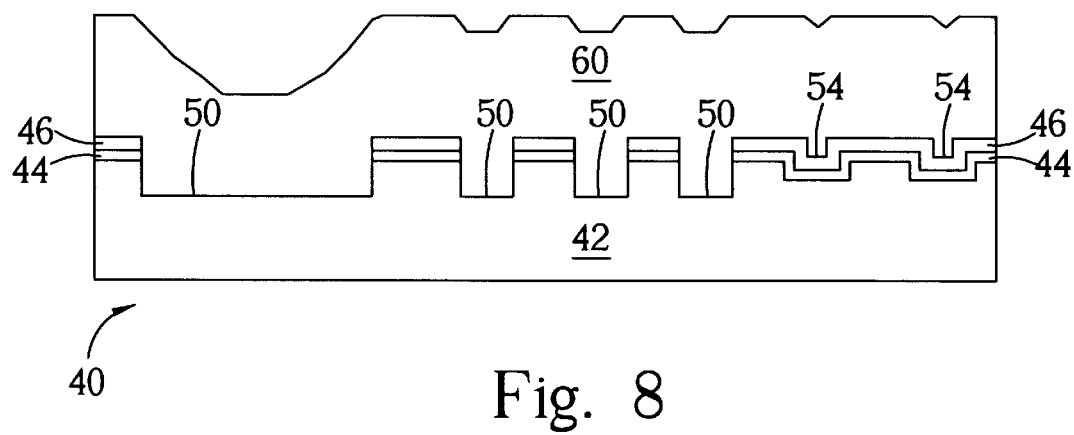
Figure 9:
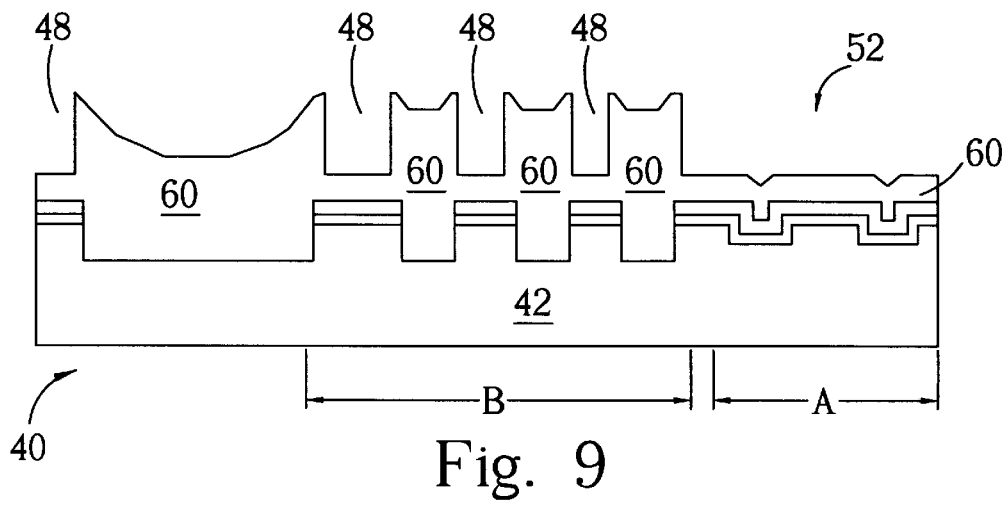
Figure 10:
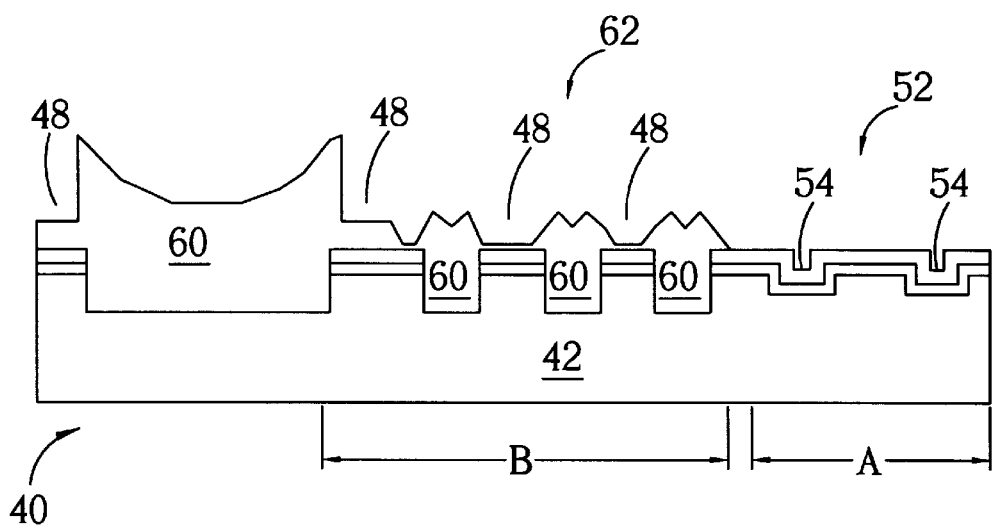
Figure 11:
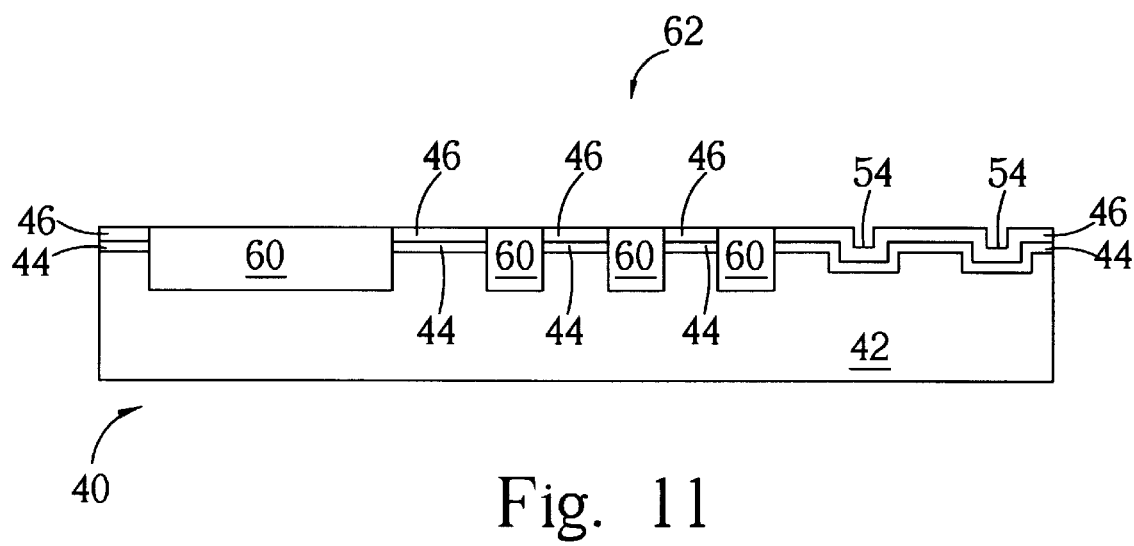

In FIG. 8, when the shallow trench isolation method of the present invention is performed, a high-density-plasma chemical vapor deposition is applied to the surface of the wafer 40 in order to form an insulation layer 60 consisting of silicon dioxide. This insulation layer 60 fills the recesses 54 in the wafer alignment region 52 and the plurality of shallow trenches 50. As shown in FIG. 9, an etching process is implemented to remove a predetermined thickness of the insulation layer 60 from the wafer alignment region 52 and the plurality of active regions 48. As shown in FIG. 10, a working region 62 (labeled as region B) is defined on the surface of the wafer 40 and has a relatively high density of active regions 48. Afterwards, as shown in FIG. 10, buffered oxide etcher (BOE) or diluted hydrofluoric acid (diluted HF) is used to implement a wet etching process to the wafer alignment region 52 and the working region 62 so as to reduce the thickness of the insulation layer 60 on the surface of the working region 62 and to completely remove the insulation layer 60 from the recesses 54 in the wafer alignment region 52. Finally, as shown in FIG. 11, a chemical mechanical polishing (CMP) process is implemented in order to remove the insulation layer 60 from the surface of the silicon nitride layer 46 and also to keep the surface of the insulation layer 60 in the shallow trenches 50 even with the surface of the silicon nitride layer 46.

As shown in FIG. 10, in the shallow trench isolation method of the present invention wet etching is performed on the wafer alignment region 52 and the working region 62 in order to reduce the average thickness of the insulation layer 60 in the working region 62. The insulation layer 60 is removed from the recesses 54 followed by removal of the insulation layer 60 from the wafer surface to a predetermined thickness as shown in FIG. 9. Then, chemical mechanical polishing (CMP) is performed (as shown in FIG. 11) to such that the surface of the insulation layer 60 in each of the shallow trenches become even with the silicon nitride layer 46. Therefore, through use of the method of the present invention, the surface of the insulation layer 60 in the shallow trenches 50 within the working region 62 are even with the surface of the wafer 40 without the need for excessive polishing. This not only adds to the stability of the shallow trench isolation process but also enhances the electrical isolating effect of the shallow trenches 50.

Figure 1:
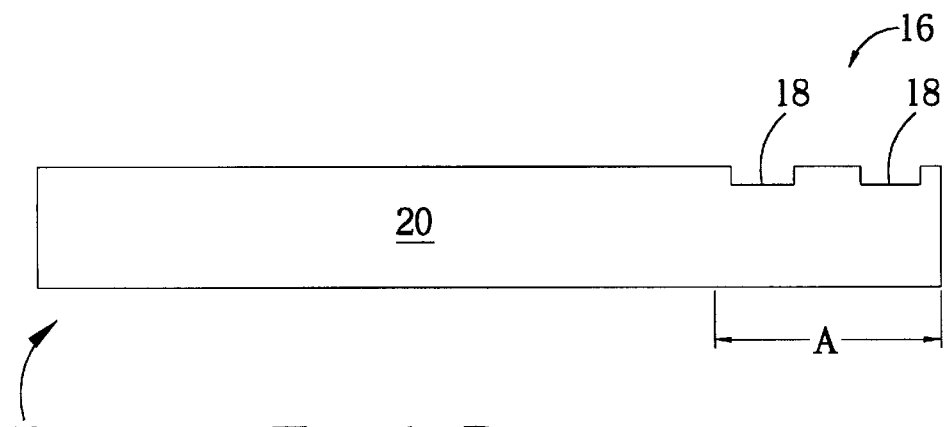
FIG. 1 and FIG. 2 are schematic diagrams of cross-sectional views of the semiconductor wafer used in the shallow trench isolation manufacturing process of the prior art.
Figure 2:
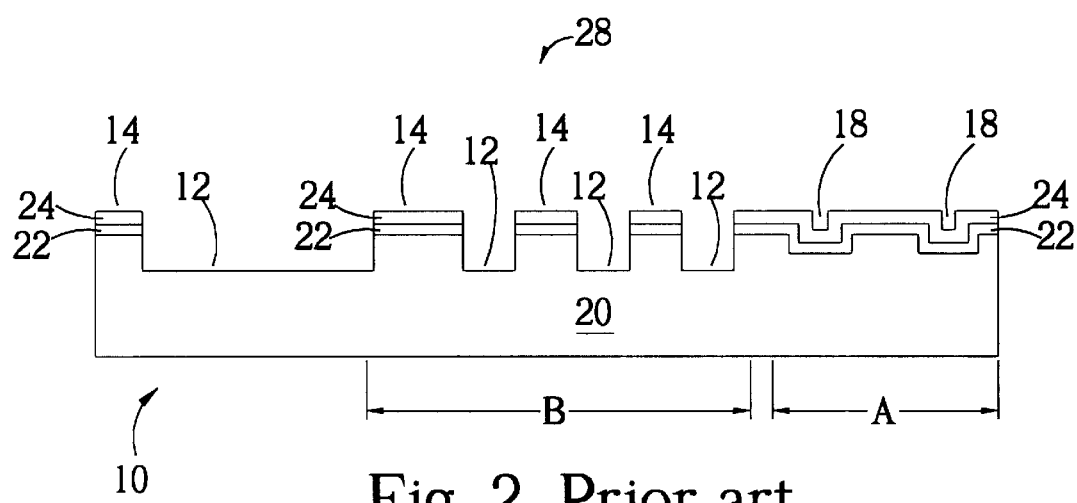
Figure 3:
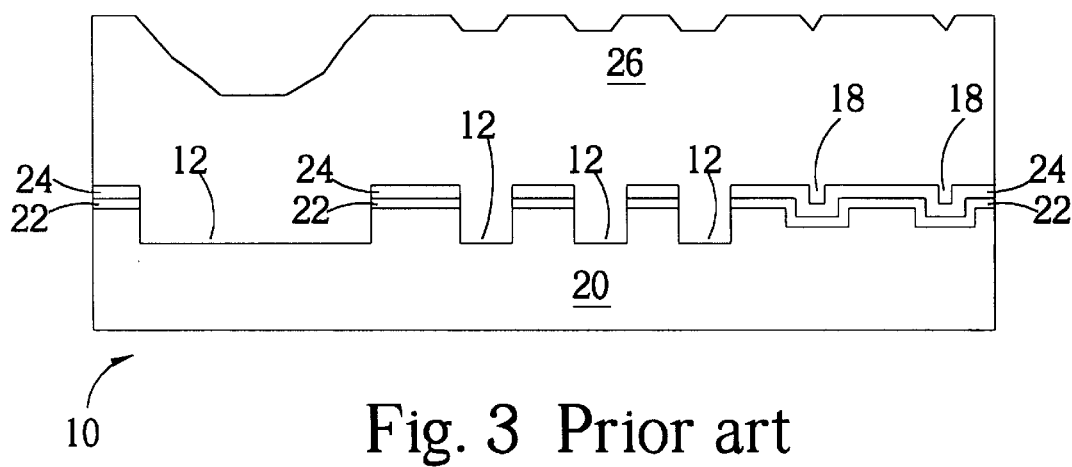
FIG. 3 through FIG. 6 are schematic diagrams of the shallow trench isolation method in a semi-conductor manufacturing process of the prior art.
Figure 4:
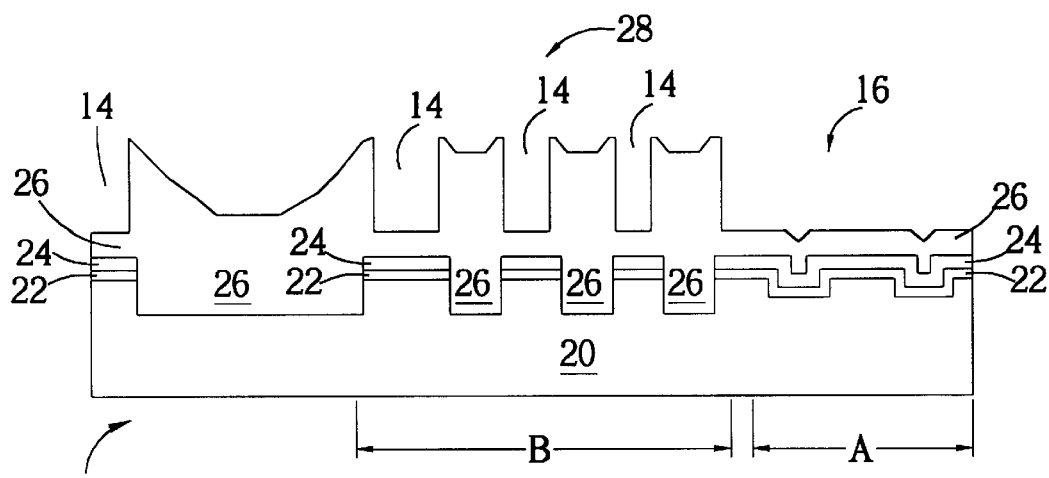
Figure 5:
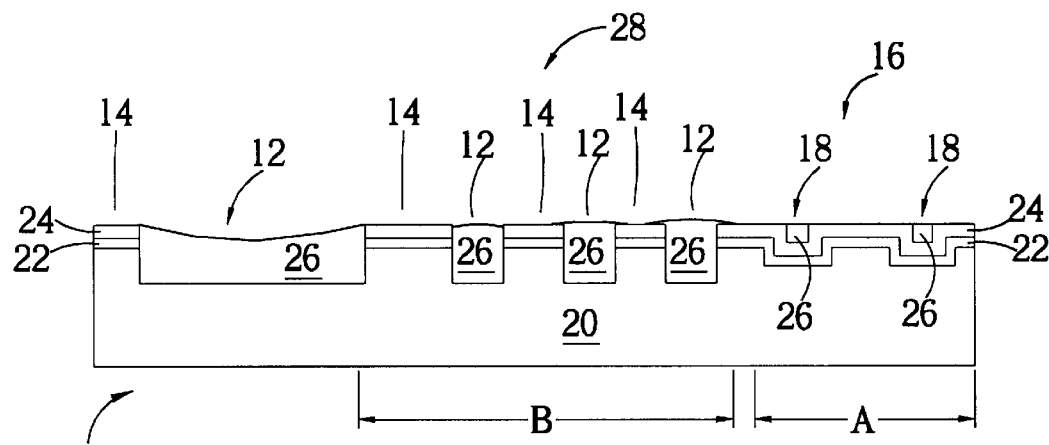
Figure 6:
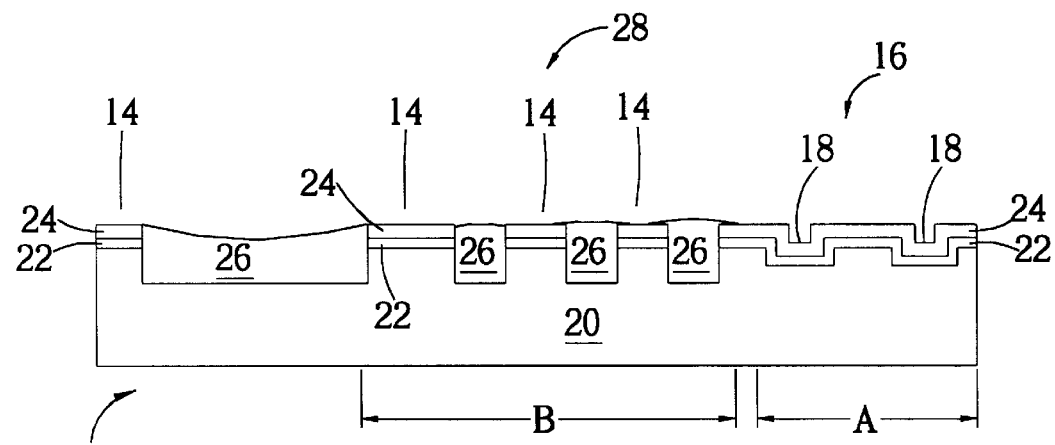

In comparison to the shallow trench isolation method of the prior art, the shallow trench isolation method of the present invention entails wet etching to reduce the thickness of the insulation layer 60 in the working region 62 following the removal of the insulation layer 60 from the surface of the wafer 40 to a predetermined thickness. Then, chemical mechanical processing (CMP) is performed to keep the surface of the insulation layer 60 in each of the shallow trenches 50 level with the surface of the wafer 40. In this way, the thickness of the insulation layer 60 in the shallow trenches 50 does not vary with the density of shallow trenches 50 in the active region 48. Therefore, the electrical isolating effect of all the shallow trenches 50 can be assured. Unlike the shallow trench isolation method of the prior art, a chemical mechanical process (CMP) is used instead of wet etching process to remove the insulation layer 26 from the surface of the wafer 10 and to keep the surface of the insulation layer 26 even with the surface of the silicon nitride 24. A comparison between FIG. 5 where the wafer 10 surface is uneven and FIG. 11 where the wafer 40 surface is even shows the benefit of the present invention.

Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A shallow trench isolation (STI) method used in a semiconductor wafer, the surface of the semiconductor wafer comprising a plurality of active regions and a plurality of shallow trenches for electrically isolating the active regions, the surface of the semiconductor wafer further comprising one alignment region having at least one recess of predetermined pattern in it, the method comprising the following steps:

forming an insulation layer on the surface of the semiconductor wafer that completely fills the trenches and the recess in the alignment region;

etching the insulation layer on the active regions and alignment region to a predetermined thickness;

defining at least one working area on the surface of the semiconductor wafer which comprises a plurality of active regions, and etching the insulation layer on the working area and the alignment region to reduce the thickness of the insulation layer on the working area and to completely remove the insulation layer on the alignment region; and performing a chemical mechanical polishing process to horizontally remove the insulation layer on the surfaces of the active regions and to approximately level the surfaces of the insulation layer in the trenches with the surfaces of the active regions.

2. The method of claim 1 wherein the density of the active regions in the working area is higher than that of the active regions outside the working area.

3. The method of claim 1 wherein the semiconductor wafer comprises:

a silicon substrate;

a silicon nitride layer positioned on the active regions and the alignment region of the silicon substrate; and a silicon oxide layer positioned between the silicon nitride layer and the silicon substrate to prevent stress-induced damage to the silicon substrate from the silicon nitride layer.

4. The method of claim 1 wherein the insulation layer is formed by performing a high-density-plasma chemical vapor deposition (HDPCVD) process.

5. The method of claim 1 wherein the insulation layer is formed of silicon dioxide.

6. The method of claim 1 wherein after defining the working area, the insulation layer within the working area and the recess of the alignment region is etched by performing a wet etching process.

7. The method of claim 6 wherein the solution used in the wet etching process is a buffered oxide etcher (BOE) or a dilute HF solution.

* * * * *